(12) United States Patent
Leverd et al.

(10) Patent No.: US 8,796,148 B2
(45) Date of Patent: Aug. 5, 2014

(54) METHOD FOR PRODUCING A DEEP TRENCH IN A MICROELECTRONIC COMPONENT SUBSTRATE

(75) Inventors: François Leverd, Saint Ismier (FR); Laurent Favennec, Villard Bonnot (FR); Arnaud Tournier, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/599,961

(22) Filed: Aug. 30, 2012

(65) Prior Publication Data

US 2013/0052829 A1 Feb. 28, 2013

(30) Foreign Application Priority Data

Aug. 31, 2011 (FR) ..................................... 11 57707

(51) Int. Cl.
*H01L 21/311* (2006.01)
(52) U.S. Cl.
USPC ........... 438/700; 438/701; 438/702; 438/703; 438/706; 438/707; 438/714
(58) Field of Classification Search
None
See application file for complete search history.

(56) References Cited

U.S. PATENT DOCUMENTS

| | | | |
|---|---|---|---|
| 6,187,685 B1 * | 2/2001 | Hopkins et al. | 438/710 |
| 2004/0097077 A1 * | 5/2004 | Nallan et al. | 438/689 |
| 2005/0287815 A1 | 12/2005 | Lai et al. | |
| 2008/0061029 A1 | 3/2008 | Lai et al. | |
| 2013/0154051 A1 * | 6/2013 | Tournier et al. | 257/510 |

FOREIGN PATENT DOCUMENTS

| | | |
|---|---|---|
| EP | 1420438 A2 | 5/2004 |
| WO | WO 9714177 A1 | 4/1997 |
| WO | WO 2008007944 A1 | 1/2008 |

OTHER PUBLICATIONS

French Search Report dated Nov. 3, 2011 from corresponding French Application No. 11/57707.

\* cited by examiner

*Primary Examiner* — Duy Deo
(74) *Attorney, Agent, or Firm* — Wolf, Greenfield & Sacks, P.C.

(57) ABSTRACT

A method for producing a deep trench in a substrate includes a series of elementary etch cycles each etching a portion of the trench. Each elementary cycle includes deposition of a passivation layer on the sidewalls and the bottom of the trench portion etched during previous cycles; followed by pulsed plasma anisotropic ion etching of the trench portion etched during previous cycles, the etching; being implemented in an atmosphere comprising a passivating species; and including a first etch sequence followed by a second etch sequence of less power than the power of the first etch sequence. The first etch sequence etches the passivation layer deposited in the bottom of the portion so as to access the substrate and etches the free substrate at the bottom of the portion while leaving a passivation layer on sidewalls of the portion.

15 Claims, 2 Drawing Sheets

METHOD FOR PRODUCING A DEEP TRENCH IN A MICROELECTRONIC COMPONENT SUBSTRATE

CROSS REFERENCE TO RELATED APPLICATIONS

This application claims the priority benefit of French patent application number 1157707, filed on Aug. 31, 2011, which is hereby incorporated by reference to the maximum extent allowable by law.

BACKGROUND

1. Technical Field

The disclosure relates to the field of deep trench production in microelectronic component substrates.

2. Discussion of the Related Art

In the microelectronics field, trenches are commonly used to define a functional element by delimiting it spatially from the adjacent elements. Additive manufacturing techniques are used for example to produce the various layers of material forming the constituent parts of the unitary detection elements of a matrix sensor, or of storage transistors for example, and then each of the unitary elements is isolated from its neighbors by making trenches around it.

A trench is however a large source of defects, and, in the absence of any treatment of the sidewalls thereof, the lower the trench form factor, i.e. the ratio between the width and the depth thereof, the more degraded the operation of the components is generally observed to be.

Indeed, the sidewalls of a trench have a number of surface defects. For example, when the trenches delimit unitary detection elements, the result is a significant noise in the signal delivered thereby and a loss of quantum efficiency, which explains why the sidewalls of a trench are commonly subjected to a treatment, and in particular overdoping when the trench is produced in a semi-conductor substrate, made of silicon for example, and/or the deposition of a passivation layer.

Furthermore, there is a plurality of method types in existence for etching a trench. Etch methods that restrict the formation of surface defects, such as dry etching for example, may be used. This method type is however very slow, and therefore incompatible with the mass production of microelectronic components. Additionally, these methods do not result in trenches with a very low form factor.

Other etch method types, and in particular plasma-based ion etching, allow trenches to be etched quickly, and are therefore compatible with the mass production of components. However, this method type comprises etching the trench portion after portion by the sequential application of elementary deposition and etch cycles. The resulting sidewalls are very irregular with a large number of overhangs and notches. The overhangs, or projections, may block up to 20% of the width of a trench of less than one micrometer. The presence of such irregularities greatly restricts the subsequent treatment of the trench sidewalls since the overhangs mask part of the sidewalls. These masked parts are thus difficult to access in respect of the subsequent deposition of a passivation layer or the implementation of overdoping.

There is therefore a need for an etch method that will both produce deep trenches with very low form factors, and typically form factors below 1/25, and produce trenches which have sidewalls substantially free of surface defects, and in particular smooth, passivated sidewalls.

SUMMARY

One embodiment thus relates to a method for producing a deep trench in a substrate comprising a series of elementary etch cycles each etching a portion of the trench, each elementary cycle comprising:
  deposition of a passivation layer on the sidewalls and the bottom of the trench portion etched during previous cycles;
  followed by pulsed plasma anisotropic ion etching of the trench portion etched during previous cycles, said etching:
    being implemented in an atmosphere comprising a passivating species; and
    comprising a first etch sequence followed by a second etch sequence of less power than the power of the first etch sequence.
  wherein the first etch sequence etches the passivation layer deposited in the bottom of said portion so as to access the substrate and etches the free substrate at the bottom of said portion while leaving a passivation layer on sidewalls of said portion.

Firstly, the passivation layer is deposited during the etching itself, each time a trench portion is etched.

Then, when etching a trench portion, the portion already etched is protected by the presence of the passivation layer. The effect of the first etch sequence of an elementary cycle is thus to etch the passivation layer deposited in the bottom of the already etched trench in order to access the substrate, and then to continue with the etching thereof, ideally as long as there is passivating material remaining on the sidewalls. The second sequence, of lower power, continues to etch the substrate while being less aggressive for the remaining passivating material, thereby preventing any over-etch phenomenon and controlling more accurately the profile of the etched portion.

The presence of the passivating species in the atmosphere when etching also serves to protect the trench sidewalls during the etching process, a thickness of a few nanometers in fact providing said protection. As a result the portion etched by an elementary cycle is smooth, and in particular without overhang or projection, enabling a very straightforward deposition of the passivation layer during the next elementary cycle. Additionally, the use of plasma-based ion etching means that deep trenches with a very low form factor can be produced rapidly.

To advantage, the method comprises at least one of the following features:
  the ion etching is fluorinated plasma etching;
  the passivation layer is a fluorocarbon layer;
  the fluorocarbon comes for example from the gases $C_4F_8$, $C_5F_8$ or $C_4F_6$;
  the power of the second etch sequence is less than or equal to 80% of the power of the first etch sequence;
  the ion etching plasma is generated between two electrodes powered by an alternating voltage at a power of between 100 watts and 1000 watts, and at a frequency of between 100 Hz and 1000 Hz, and, in particular, a frequency of 400 Hz;
  the plasma is pulsed with a duty cycle above or equal to 50%, and, in particular, a duty cycle equal to 55%;
  the plasma pulse frequency is between 500 Hz and 2000 Hz, and is, in particular, equal to 1000 Hz;
  during ion etching the temperature of the substrate is below the condensation temperature of the passivating species, and, in particular, a temperature below or equal to −10° C. for a fluorinated passivating species;

the duration of the deposition of the passivation layer is between 0.7 seconds and 1 second;

the duration of the first etch sequence is between 0.5 seconds and 1 second; and the duration of the second etch sequence is between 0.7 seconds and 1 second.

BRIEF DESCRIPTION OF THE FIGURES

The embodiments will be better understood from reading the following description, given solely by way of example, and given in relation to the appended drawings, wherein identical reference numbers denote identical or functionally similar elements, and wherein.

DETAILED DESCRIPTION

An inventive embodiment will now be described in relation to FIGS. 1 to 5, the various layers having been deliberately exaggerated in the interests of greater clarity.

The method comprises a series of elementary etch cycles, each etching a portion of a trench 10 produced in a substrate 12, for example a semi-conductor substrate, in particular of silicon.

Figure 1:
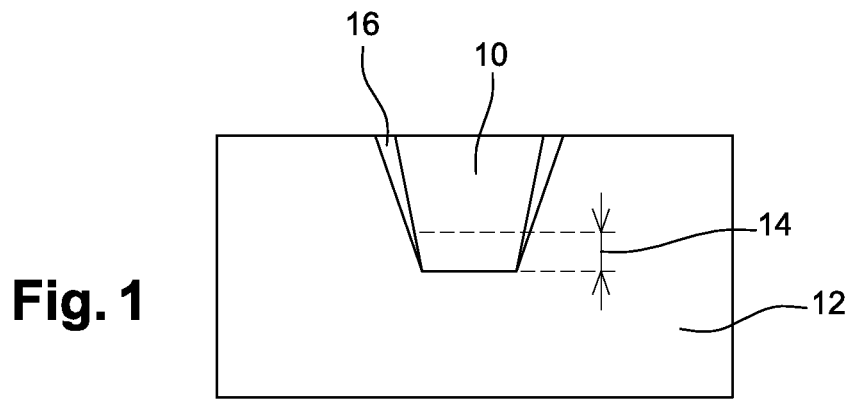
FIGS. 1 to 5 are schematic cross-section views showing an elementary etch cycle of one embodiment of the method according to the invention.

FIG. 1 shows the result obtained at the end of previous elementary cycles, the result of the last elementary cycle 14 being shown between the dotted lines. In particular, the trench 10 is coated with a passivation layer 16 of decreasing thickness.

Figure 2:
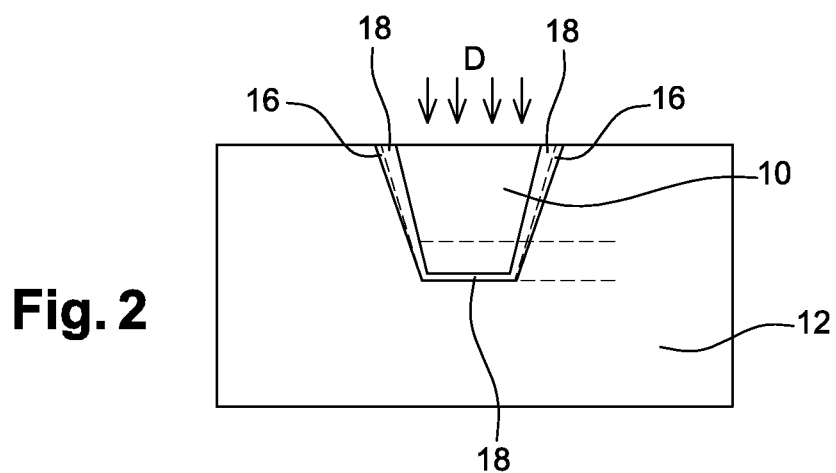

An elementary cycle starts with the deposition of a new passivation layer 18 in the trench 10. For example, a plasma is used with only a fluorocarbon gas which deposits a carbon- and fluorine-based polymer on the side walls and the bottom of the trench 10 (FIG. 2). The passivation layer deposited 18 is to advantage constituted by fluorocarbon, and comes, for example, from the gases $C_4F_8$, or $C_5F_8$ or $C_4F_6$. To advantage, the duration of the deposition is chosen so that a layer of significant thickness is deposited, in excess of 10 nanometers, without running the risk of blocking the trench. The duration is, for example, between 0.7 seconds and 1 second.

Figure 3:
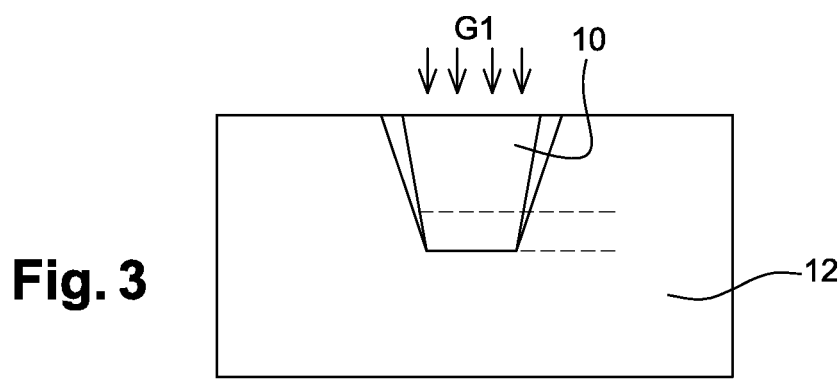
Figure 4:
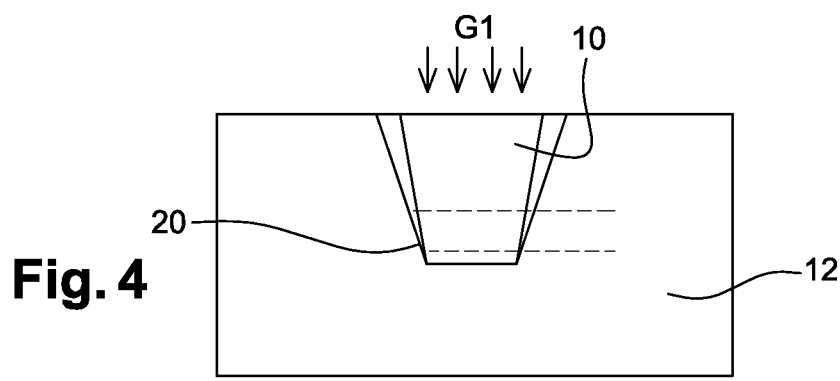

The elementary cycle then continues with the application of a first sequence G1 of pulsed plasma-based an isotropic ion etching in an atmosphere that includes a passivating species, and to advantage a fluorocarbon, and in particular $C_4F_8$, $C_5F_8$ or $C_4F_6$, and a species of use in etching, to advantage a fluorinated gas particularly $CF_4$ or $SF_6$. The etching power and application time are chosen so as to etch the bottom of the trench 10 which comprises the passivation layer 18 and thereby access the substrate 12 (FIG. 3).

To advantage, the first sequence G1 continues until there remains a few nanometers of passivation layer 18 in the lower part of the trench, which allows an additional etching of the substrate 12 (FIG. 4) to start. The presence of the passivating species in the plasma also makes it possible, during the etching process itself, to deposit a passivation film 20 which protects the bottom of the trench from an over-etch causing projection and overhang.

Preferably, the conditions for depositing this film 20 are optimized by subjecting the trench to a temperature below the condensation temperature of the passivating species, for example a temperature below or equal to −10° C. for fluorocarbons, and/or by regularly cutting off the generation of the etching plasma.

Indeed, the plasma is commonly generated by subjecting an inert gas to electric discharges, such as argon for example, which creates ions bombarding the surface for etching. In particular, the plasma is generated between two electrodes a few centimeters apart and connected to an alternating electricity supply, with a frequency of between 100 Hz and 1000 Hz, and for example 400 Hz, and between 100 watts and 1000 watts of power, allowing a pulsed plasma and anisotropic ion etching to be generated. The plasma pulse frequency is between 500 Hz and 2000 Hz, and is, in particular, equal to 1000 Hz.

However, during plasma generation, the passivating species is also ionized. In fact ions are deposited with greater difficulty on the walls of a trench than non-ionized molecules. By regularly cutting off plasma generation, it is the non-ionized passivating molecules which are deposited during these regular cut-offs, thereby facilitating the formation of the film 20. To advantage, the plasma generation duty cycle, i.e. the percentage of the time during which the plasma is generated, is above 50%, and preferably equal to 55%.

The duration of the first sequence is chosen so as to etch the substrate 12 to the limit with no danger of any over-etch phenomenon. For example, the duration of the first sequence is between 0.7 seconds and 1 second.

Figure 5:
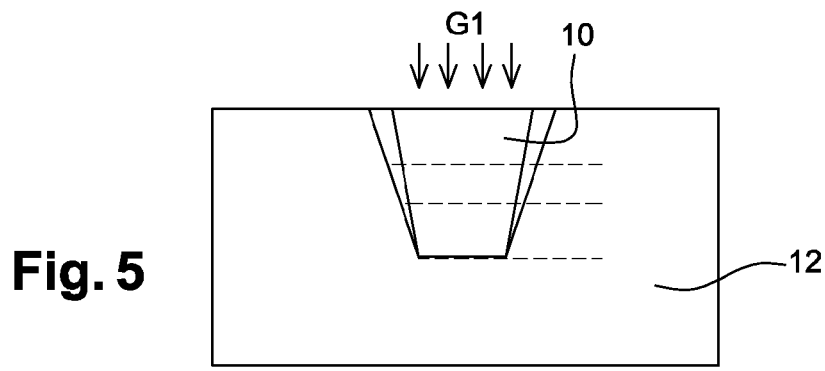

The elementary cycle then continues with a second ion etch sequence G2 which differs from the first sequence G1 by a lower power of the plasma. In particular, the power of the plasma in the second sequence G2 is less than or equal to 80% of the power of the plasma in the first sequence G1. By reducing the plasma power in this way, it is more difficult to etch the passivation material deposited on the trench walls, while continuing to etch the substrate 12. Indeed, the material on the sides is etched less quickly since it sustains less bombardment than the trench bottom. Any over-etch phenomenon is thus avoided while exact control is kept of the profil of the trench 10. At the end of the second etch sequence G2, a new trench portion is thus obtained which is smooth and passivated (FIG. 5).

Since the power of the second sequence is reduced relative to that of the first sequence, the substrate is thus etched more slowly. In the knowledge that the first sequence G1 also etches the substrate 12, but at a more sustained rate, advantageously, the duration of the second sequence is also chosen so as to optimize the overall etching time. In particular, the length of time during which the second sequence is applied is between 0.7 seconds and 1 second.

The method previously described is implemented in a conventional ion etch plasma chamber, modifying the prior art operating parameters. Reference may be made, for example, to the document "*Manufacturing integration considerations of through-silicon via etching*" by Steve Lassig, journal Solid State Technology, December 2007 (http://www.electroiq.com/articles/sst/print/volume-50/issue-12/features/cu-low-k/manufacturing-integration-considerations-of-through-silicon-via-etching.html), to the document "*Etch Challenges for 3-D Integration*" by H. Singh et al., Proceedings of the 3rd Plasma Etch and Strip in Microelectronics Workshop, Grenoble 2010, and to the document "*the yole developpement magazine micronews n° 6*", September 2007.

Figure 6:
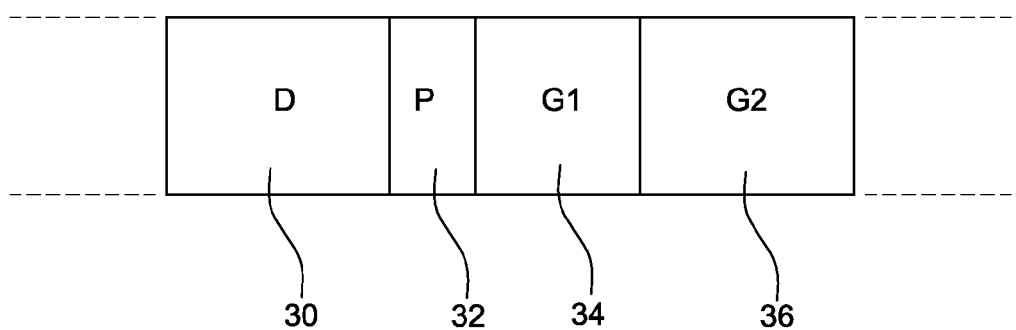
FIG. 6 is a timing diagram showing an elementary cycle for controlling an ion etch plasma chamber for implementing the inventive method.

The settings for the elementary cycle previously described are shown in FIG. 6 which describes an elementary control cycle, said cycle comprising:

a step 30 of controlling the chamber for the deposition of a passivation layer 18. To do this, a pure fluorocarbon gas plasma is used which will deposit a layer of carbonaceous polymer on the patterns. The plasma generation circuit of the chamber is cut off, and a passivating species is introduced into the chamber. A chemical vapor deposition is implemented, for example;

a step 32 of controlling the chamber in order to bleed the chamber. Bleeding is used to remove excess passivating gas from the chamber in order to help the etch process;

a first step of controlling 34 ion etching with a fluorinated gas during which the discharge electrodes are controlled for the power pulsed plasma-based anisotropic etch sequence G1. Simultaneously, a passivating species is also introduced into the chamber.

a second step of controlling 36 ion etching comprising reducing the plasma power in order to implement the second etch sequence G2.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Method for producing a deep trench in a substrate including a series of elementary etch cycles each etching a portion of the trench, each elementary cycle comprising:
deposition of a passivation layer on the sidewalls and the bottom of the trench portion etched during previous cycles;
followed by pulsed plasma anisotropic ion etching of the trench portion etched during previous cycles, said etching:
being implemented in an atmosphere including a passivating species; and
including a first etch sequence followed by a second sequence of less power than the power of the first etch sequence,
wherein the first etch sequence etches the passivation layer deposited in the bottom of said portion so as to access the substrate and etches the free substrate at the bottom of said portion while leaving a passivation layer on sidewalls of said portion.

2. Method as claimed in claim 1, wherein the ion etching is fluorinated plasma etching.

3. Method as claimed in claim 1, wherein the passivation layer is a layer of fluorocarbon.

4. Method as claimed in claim 3, wherein the fluorocarbon comes from $C_4F_8$, $C_5F_8$ or $C_4F_6$.

5. Method as claimed in claim 1, wherein the power of the second etch sequence is less than or equal to 80% of the power of the first etch sequence.

6. Method as claimed in claim 1, wherein the ion etching plasma is generated between two electrodes powered by an alternating voltage with between 100 watts and 1000 watts of power, and a frequency of between 100 Hz and 1000 Hz.

7. Method as claimed in claim 1, wherein the plasma is pulsed with a duty cycle above or equal to 50%, and in particular a duty cycle equal to 55%.

8. Method as claimed in claim 1, wherein the plasma pulse frequency is between 500 Hz and 2000 Hz.

9. Method as claimed in claim 1, wherein, during the ion etching, the temperature of the substrate is below the condensation temperature of the passivating species.

10. Method as claimed in claim 1, wherein the duration of the deposition of the passivation layer is between 0.7 seconds and 1 second.

11. Method as claimed in claim 1, wherein the duration of the first etch sequence is between 0.5 seconds and 1 second.

12. Method as claimed in claim 1, wherein the duration of the second etch sequence is between 0.7 seconds and 1 second.

13. Method as claimed in claim 6, wherein the frequency is 400 Hz.

14. Method as claimed in claim 8, wherein the plasma pulse frequency is 1000 Hz.

15. Method as claimed in claim 9, wherein the temperature of the substrate is below or equal to −10° C. for a fluorinated passivating species.

* * * * *